United States Patent [19]

Brotz

[11] Patent Number: 4,681,981
[45] Date of Patent: Jul. 21, 1987

[54] THERMOVOLTAIC CELLS

[76] Inventor: Gregory R. Brotz, P.O. Box 1322, Sheboygan, Wis. 53081

[21] Appl. No.: 760,111

[22] Filed: Jul. 29, 1985

Related U.S. Application Data

[63] Continuation-in-part of Ser. No. 612,718, May 21, 1984, which is a continuation-in-part of Ser. No. 588,344, Mar. 12, 1984.

[51] Int. Cl.$^4$ ............................................. H01L 35/30
[52] U.S. Cl. .................................... 136/205; 136/224; 322/2 R
[58] Field of Search ............... 136/200, 201, 202, 205, 136/228, 233, 224

[56] References Cited

U.S. PATENT DOCUMENTS 3,087,002  4/1963  Henderson et al. ................ 136/205
3,358,162  12/1967 Krake et al. ....................... 136/205
3,554,807  1/1971  Kellner .............................. 136/205

Primary Examiner—John F. Terapane
Assistant Examiner—T. J. Wallen
Attorney, Agent, or Firm—William Nitkin

[57] ABSTRACT

An electricity-producing cell utilizing a foamed multiple thermocouple made of a conductive open-cellular foam matrix, a portion of which forms a first pole with a plurality of discrete conductors of a different material from the foam matrix embedded in the foam having a portion of each of the discrete conductors being exposed on the insides of the cells of the foam forming a plurality of thermocouples with means to contact the discrete conductors to convey current produced by the thermocouples to a second pole with means to heat the discrete conductors, in some embodiments, being radioactive isotopes.

7 Claims, 16 Drawing Figures

THERMOVOLTAIC CELLS

This application is a continuation-in-part of my previously filed application for Foamed Multiple Thermocouple filed May 21, 1984, Ser. No. 612,718 now pending which is a continuation-in-part of my previously filed application for a Foamed Nuclear Cell filed Mar. 12, 1984, Ser. No. 588,344 now pending.

BACKGROUND OF THE INVENTION

1. Field of the Invention

The present invention relates to novel thermoelectric cells, the structures thereof, their method of manufacture and use, and more particularly relates to the use of foamed multiple thermocouples in such cells, some of which utilize radioactive fuel therein.

2. History of the Prior Art

Multiple junction thermoelectric devices or thermocouples are known in the prior art. Examples of patents disclosing such devices are as follows:

U.S. Pat. No. 3,256,701, Henderson
U.S. Pat. No. 3,269,871, Kilt et al.
U.S. Pat. No. 3,285,018, Henderson et al.
U.S. Pat. No. 3,343,373, Henderson et al.
U.S. Pat. No. 3,358,162, Krake et al.
U.S. Pat. No. 3,780,425, Penn et al.
U.S. Pat. No. 3,821,053, Wilcox.

Thermoelectric cells which rely on heat produced by radioactive energy absorbed by a thermopile have been reviewed in an article in *Nucleonics*, Vol. 13, No. 11, pages 129–133 (1955) by A. Thomas entitled "Nuclear Batteries, Types and Possible Uses."

SUMMARY OF THE INVENTION

It is an object of this invention to create electricity-producing cells utilizing multiple thermocouples within a foamed structure with one pole of the thermocouple ultimately being the basic structure of the foam and the second pole contacting discrete elements embedded internally within the foam structure by various means. The basic theories of thermocouples are well known in the art and since an increase in size of a total single bi-material contact area has no effect on the thermocouple's output, it has long been desired and strived for to find ways of creating multiple junctions within a thermocouple. The creation of such multiple junctions has been accomplished through many different methods as disclosed by the prior art, but the object of this invention is to disclose a totally unique and new field of multiple thermocouple production heretofore unknown and the use of those multiple thermocouples in electricity-producing cells.

One method of accomplishing the production of multiple thermocouples within foam is to utilize coarse granules of a conductor such as a boron carbide or equivalent and mold them along with low-carbon residue thermoplastic beads and a high-carbon residue resin. After baking this molded structure at extremely high temperatures to vaporize the beads, an open-cellular carbon foam structure is created wherein the granules form discrete conductors embedded within the cell walls of the foam. These conductors may not necessarily commute to the surface of the internal structure of the foam. In order to make more of the embedded conductors commute with the internal surfaces of the foam structure, one partially oxidizes the carbon foam, leaving a plurality of the embedded conductors exposed on the internal surfaces of the foam's cells. During operation of the thermocouple, electrical contact with the embedded material in some embodiments can be made by an ionized flame from combustion which flame also provides the heat to power the cell. This is done by utilizing such flame as a conductor. Because the foam is being used as a combustion containment medium and the ionized flame protrudes externally from the foamed structure, the flame acts as a contact with all the internal surfaces of the foamed thermocouple thereby contacting discrete conductor granules embedded therein. The junction is completed using the carbon foam structure as the embedded conductors all contact the carbon foam which foam becomes one pole of the cell. The other pole is formed from a pole or screen contact with the ionized flame. In some embodiments it may become necessary to electrically insulate the carbon portion of the internal surface of the foam from the flame conductor. To accomplish this insulation, silicon vapor can be passed through the foam as the foam is being dielectrically heated which process will form a silicon carbide on the inside surfaces of the carbon foam. If some of the exposed surfaces of the boron carbide granules are also covered by a silicon carbide formation, then this silicon carbide may be removed by first placing the foamed structure in a vacuum. Then electron plasma in the foam is formed via a pole adjacent to the foam with the foam's carbon matrix being the second pole. The plasma conducts to any silicon carbide formed on the boron carbide granules as the underlying boron carbide granules are more conductive than the carbon foam which great heat will vaporize and re-expose the boron carbide as this path offers the least electrical resistance. As the plasma penetrates the foam, the silicon carbide over the boron carbide heats up because the silicon carbide acts as an insulator but only the silicon carbide formed over the boron carbide within the internal foam structure will vaporize or decompose and be carried away by the vacuum. The remaining silicon carbide formation will still cover and insulate the carbon foam section so that the ionized flame of combustion will contact and excite only the exposed boron carbide granules, and the remaining silicon carbide will act as an insulator of the carbon foam structure.

Such foamed multiple thermocouple material can also be used in a thermoelectric nuclear cell when the foamed multiple thermocouple is placed in a chamber with a thermally-active isotope and a conductive medium such as a liquid electrolyte, conductive gas or a vacuum. The heat from the isotope is converted to electrical current by means of the thermocouple effect.

Other methods to accomplish the best modes of creating multiple thermocouples are disclosed in this application and reference is made to the accompanying drawings and description of the preferred embodiments where such objects and methods will become more readily apparent.

DESCRIPTION OF THE PREFERRED EMBODIMENT(S)

Figure 1:
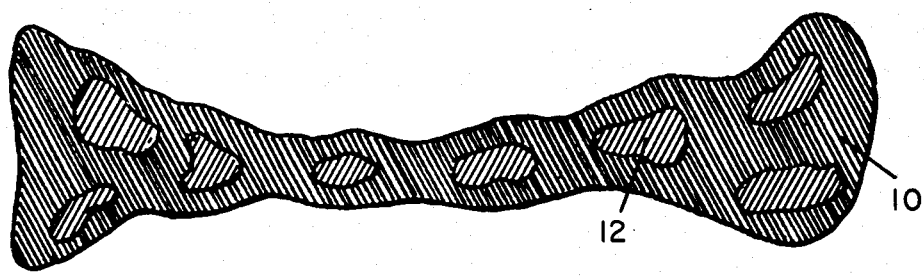
FIG. 1 illustrates a planar section of a cell wall of a foamed thermocouple with boron carbide granules embedded in the foam after carbonization and vaporization of the beads therefrom.
Figure 2:
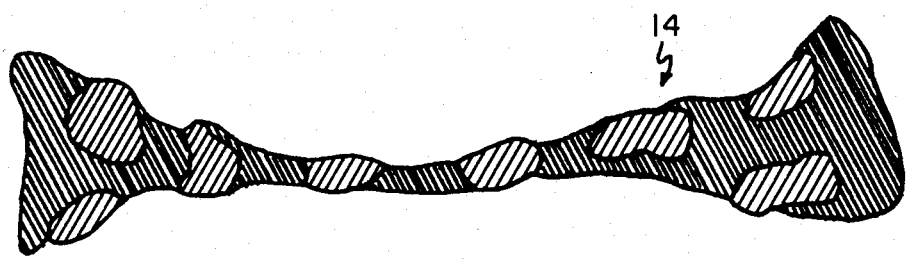
FIG. 2 illustrates a planar section of a foamed thermocouple after oxidation of the portion of the carbon to further expose the boron carbide granules.
Figure 3:
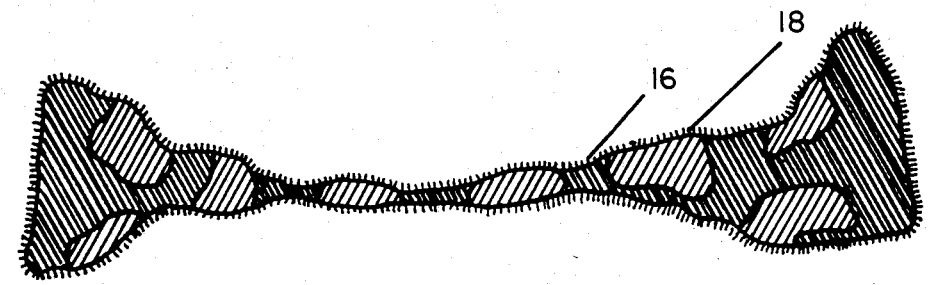
FIG. 3 illustrates a planar section of a foamed thermocouple after treatment with silicon vapor.
Figure 4:
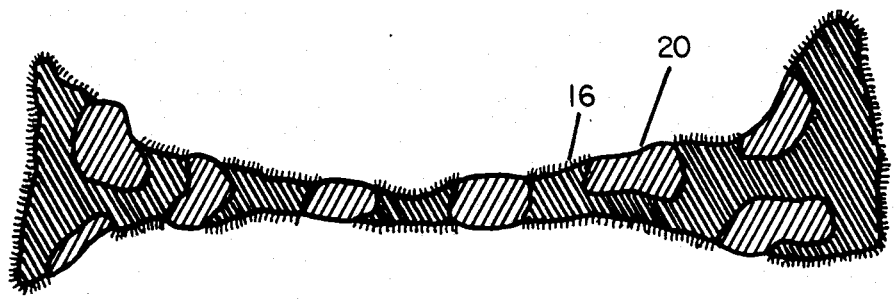
FIG. 4 illustrates a planar section of a foamed thermocouple after electron plasma treatment to remove silicon carbide from above the boron carbide granules.

In order to create a carbon foam, one can mix thermoplastic beads with a resin and bake this mixture at a temperature which vaporized the beads while at the same time carbonizing the resin to form an open-cellular foam structure. It is such a structure that is utilized in one embodiment of this invention. In producing a multiple thermocouple utilizing a foamed structure, one can mix in one method granules of a conductor such as boron carbide or equivalent and mold the granules along with low-carbon residue thermoplastic beads and a high-carbon residue resin. After the foamed structure is carbonized by baking it at a high temperature, the thermoplastic beads have been vaporized out of the structure and the high-carbon residue resin leaves a carbon structure containing the dissimilar conductors embedded in it as seen in FIG. 1. FIG. 1 shows a planar section of such a foam being a cross-section of a one-cell wall with carbon structure 10 and boron carbide granule 12 embedded therein. These boron carbide granules do not necessarily at this point make any contact with the outer surfaces of the inner cell walls of the carbon foam and in order for the thermocouple to work, one must have these embedded conductors be exposed within the internal cells of the foam. To accomplish this exposure, one can partially oxidize the carbon foam, leaving the embedded conductors exposed to the internal surfaces of the foam's cells as seen in FIG. 2 where a portion indicated as area 14 of carbon 10 has been oxidized away leaving the exposed boron carbide granules still held within the carbon foam of the cell. To electrically insulate the carbon structure of the internal surface of the foam from the ionized flame of combustion which forms the contact to the discrete conductors being in this example the exposed boron carbide granules, one can in one process coat the internal structure of the foam with a silicon vapor which can be passed through the foam as the foam is being dielectrically heated which vapor then combines with the carbon foam to form silicon carbide 16 on the surface of the carbon. Some of the silicon carbide 18 may be deposited on the exposed boron carbide granules. One can then place this foam structure in a vacuum and cause an electron plasma to form between a first pole adjacent to the foam with the foam's carbon matrix being the second pole. The plasma will complete the circuit and conduct through the silicon carbide formed on the boron carbide as the boron carbide is more conductive than the surrounding carbon matrix structure and this path of current flow offers the least electrical resistance. FIG. 4 shows the result of such plasma treatment where the silicon carbide has been vaporized and carried away by the vacuum pump. Silicon carbide is an electrical insulator and thus will be heated in an electrical current. The underlying boron carbide particles act as a shunt so that the plasma current flow will pass through them. The silicon carbide converted from boron carbide is substantially thinner than the silicon carbide formed from the reaction of carbon and silicon in the regions surrounding the boron particles. This is a cleaning step and may even be accomplished by chemical treatments or by the burning in phase of the cell during its first operation.

Figure 5:
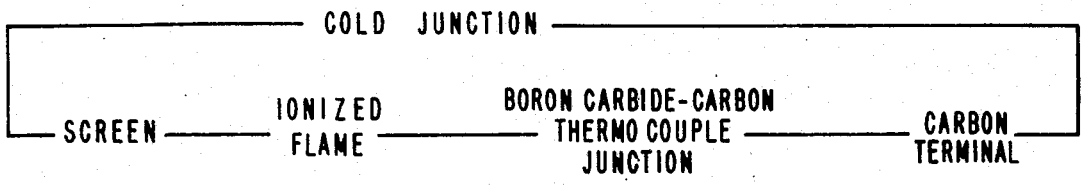
FIG. 5 illustrates a junction diagram of a typical cell of this invention.
Figure 6:
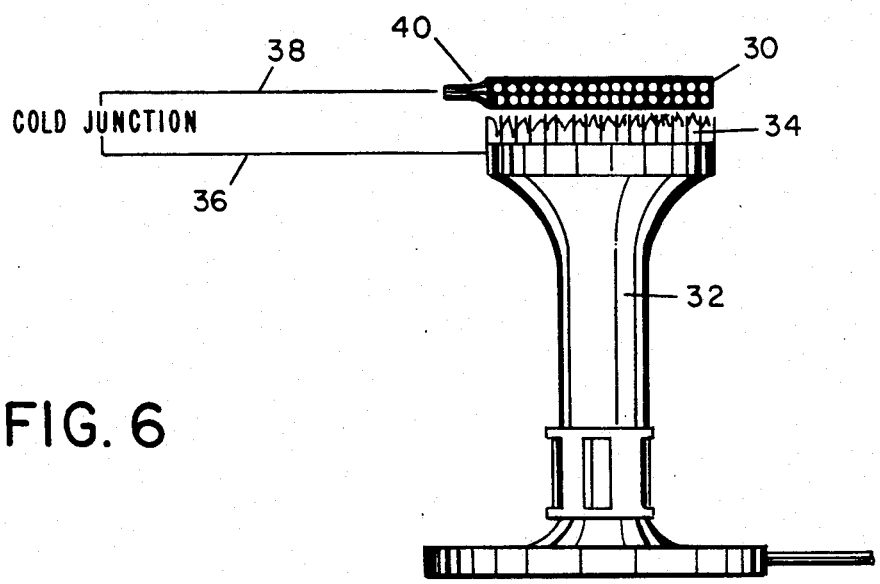
FIG. 6 illustrates a foamed thermocouple in an ionized flame of combustion to produce current.

One than can operate the foam thermocouple of this invention by entering an ionized flame of combustion therein as illustrated diagramatically in FIG. 5 showing the junction with the carbon terminal being formed from the matrix of the foam and the boron carbide carbon junction with the exposed portion of boron carbide granules contacting the ionized flame entered therein having a pole member in contact therewith or passing through a screen contact pole over such ionized flame. The junction of the carbon foam terminal may be a portion of the carbon foam formed into a more solidified section to allow a lead to be attached thereto. FIG. 6 is a simplified structure showing the foamed thermocouple 30 above a burner 32 having a flame 34 make contact with a lead 36 and pass through the foam thermocouple where the second contact 38 is attached to the carbon matrix 40 of the foam.

Figure 7:
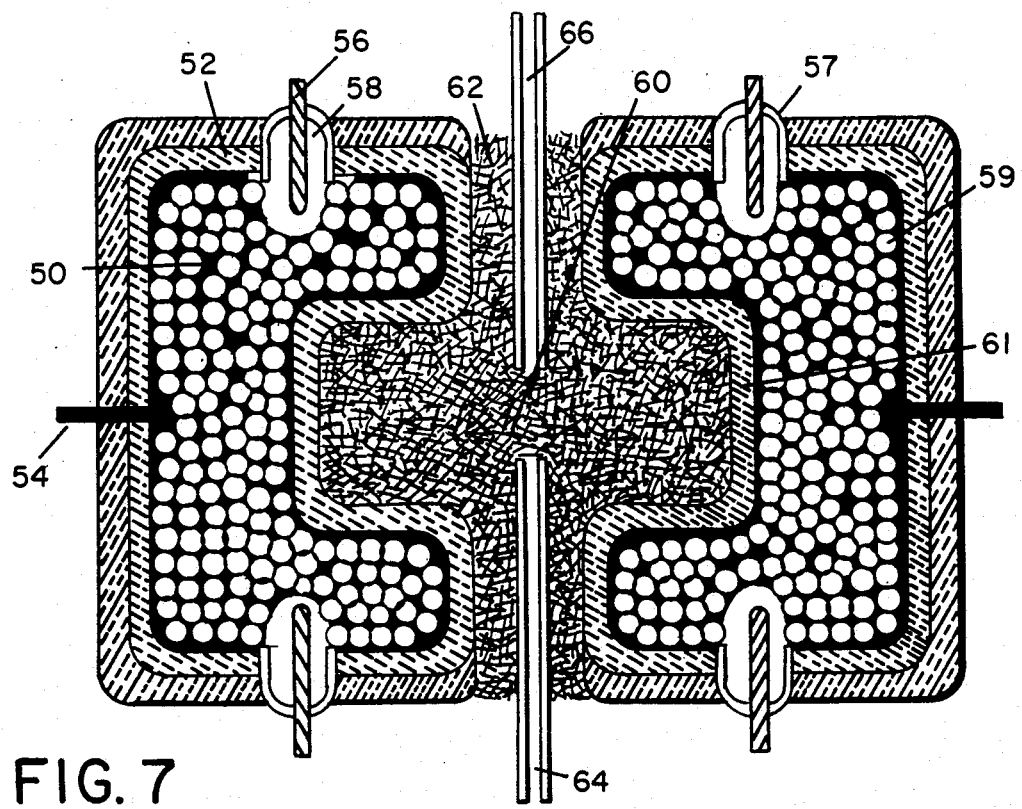
FIG. 7 illustrates a cell utilizing a foamed thermocouple to produce current upon the entry of an ionized flame of combustion therein.

A more complex cell utilizing such structure is seen in FIG. 7 wherein the foamed thermocouple material 50 is held within a container 52 and a first electrode 54 is formed from a protrusion of the carbon foam matrix with a second electrode 56 entered into a space within the open-cellular foam. A flame to produce heat can be entered into such a cell by means of a centrally located combustion area which can contain glass wool and have the fuel entered from a first port 64 and air to support the combustion entered from a second port 66.

This embodiment does not rely on electrical continuity being made through an ionized flame. Instead, the entire container 52 containing the foamed thermocouple material is filled with an electrically conductive medium 59 penetrating and contacting the insides of the foam. Examples of such conductive mediums are salt water, ammonium chloride solution, a conductive gas such as argon or equivalent, a vacuum, a solid material that was poured while in a liquid state into the unit and thus filling all the interstices of the foam before solidifying or a metal such as tin that can be molten during operation of the cell. These conductive mediums are only examples and other equivalent mediums to conduct electricity could be utilized. Dome 57 can be made of electrically insulative material so as to isolate pole 56 from the carbon foam matrix. Heat from the central combustion chamber 60 penetrates inner chamber wall 61 and into the foamed thermocouple 50 containing its electrolyte 59. The electrical path is made through pole 54 of the carbon foam matrix, through the discrete conductive particles in the foam, then from them through the electrolyte 59 to pole 56.

Figure 8:
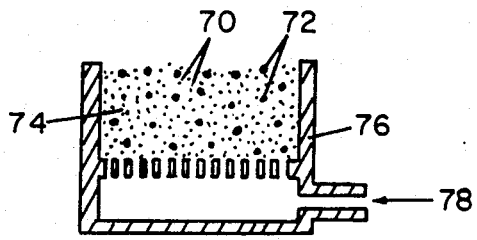
FIG. 8 illustrates a step of another method of creating a foamed carbon thermocouple where boron carbide granules are stuck around and embedded on the surface of thermoplastic beads.
Figure 9:
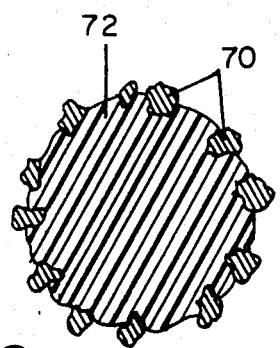
FIG. 9 illustrates boron carbide granules stuck to a thermoplastic bead.
Figure 10:
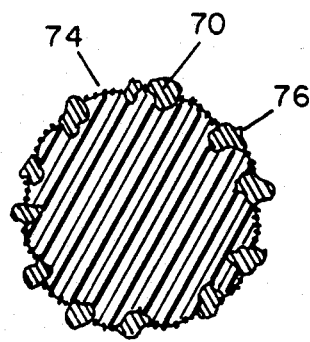
FIG. 10 illustrates the bead of FIG. 9 having silicon powder adhered thereon.
Figure 11:
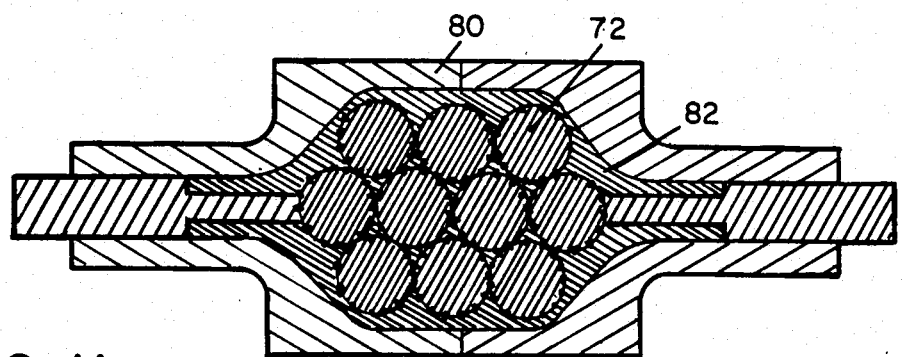
FIG. 11 illustrates beads placed along with a carbonizable thermosetting resin with the protruding portions of the boron carbide particles and the silicon powder contacting the curing resin.
Figure 12:
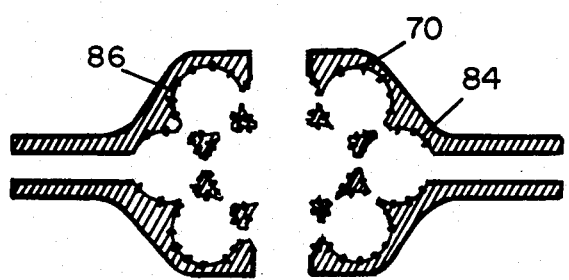
FIG. 12 illustrates a foam, after the beads have been vaporized out of the matrix by heat, showing the boron carbide granules embedded in the cell walls that have been created in the foam and silicon carbide formed on the inner surfaces of the foam between the boron carbide granules.
Figure 13:
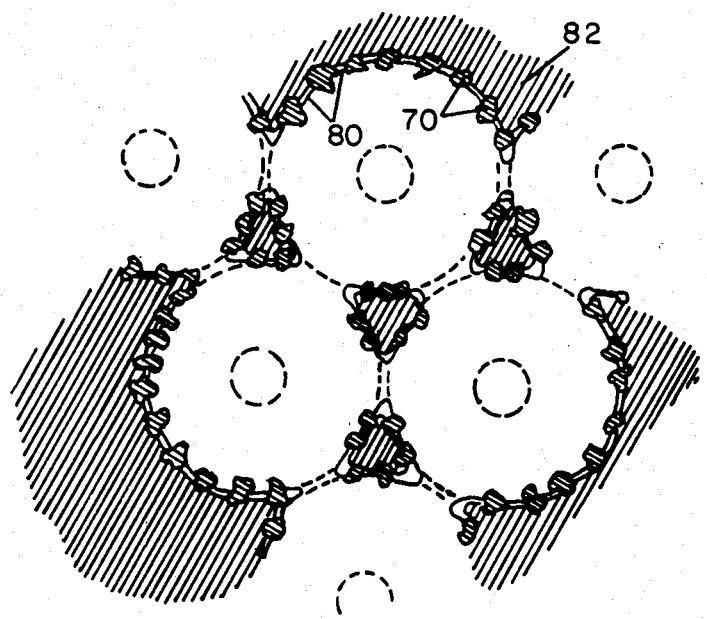
FIG. 13 illustrates a cross-section of a cell showing the boron carbide granules embedded in the foam matrix.
Figure 14:
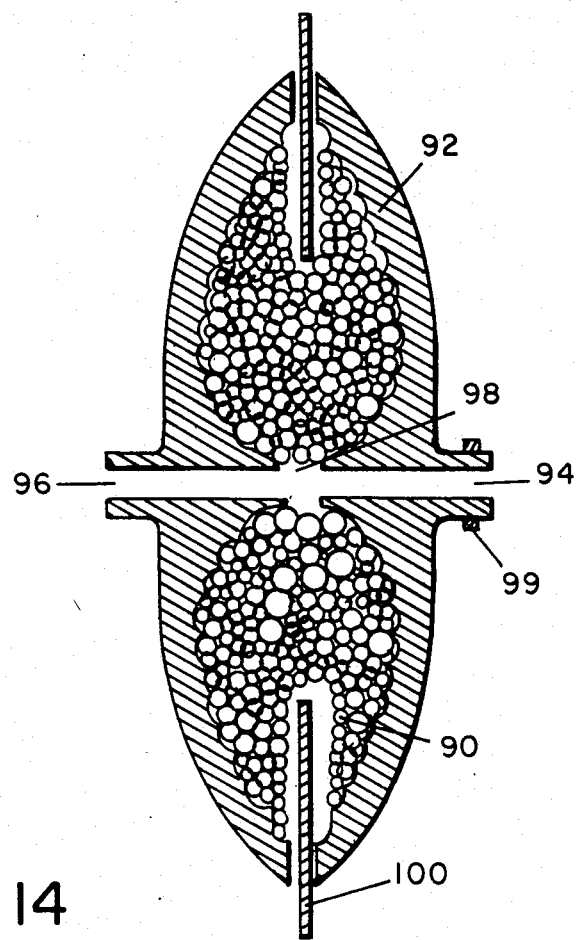
FIG. 14 illustrates a foamed thermocouple cell embodiment.

Another method of producing such a foam thermocouple structure utilizing a different method and technique of manufacture is shown in FIG. 8. The conductors 70 being boron carbide granules or equivalent are placed with low carbon residue thermoplastic beads 72 in a fluid bed 76 where the temperature of a fluidizing gas 78 is raised to the softening point of the thermoplastic resin beads. At this point the boron carbide granules 70 will stick to and be embedded in the outer surface of each of the softened beads 72 as seen in FIG. 9. The temperature of the fluidizing bed is then lowered so that the boron carbide granules become rigidly affixed to the surface of the beads in which they are embedded as the beads reharden. The beads thus produced are then separated from the remaining unused portion of the boron granules by a screening classification method as to the size of the remaining granules, the boron carbide granules being much smaller than the plastic beads having boron carbide granules embedded therein. These boron carbide granule-embedded beads are then fluidized again along with a silicon powder by raising the temperature of the fluidizing gas to the thermoplastic softening point as before which now adheres the surrounding silicon powder 74 to the still exposed softened surface of the beads at all positions where there are no boron carbide granules as seen in FIG. 10. The silicon, though, does not adhere to the surface 76 of the boride granules. This adhering can be accomplished in the same kind of process as illustrated for adhering the boron carbide granules to the plastic beads. One then forms a mold 80 as seen in FIG. 11 and positions the beads with adhered silicon and boron particles within a carbonizable thermosetting resin 82 and these granules on the exterior of the beads now become surrounded by the curing resins, and the silicon powder is likewise compressed into the curing resin. Once molded, this structure is put through a carbonizing cycle and baked to a point where the thermoplastic beads being ones yielding no carbon residue are vaporized out of the carbon matrix and the boron granules are left embedded in the carbon cell walls 84 as well as the silicon powder being reacted with the carbon by the heat at the positions where there are no boron granules forming a silicon carbide 86 to act as an electrical insulator over the carbon foam as seen in FIG. 12. This method has certain advantages over the first disclosed method in that there is no silicon carbide formed on the granules that later has to be removed by a plasma. FIG. 13 is a plan cross-sectional view of a section of such a foam thermocouple with beads having been vaporized out of the carbon matrix showing the boron carbide granules 70 and the insulating silicon carbide 80 formed therebetween still allowing the boron carbide granules to have contact with the carbon 82 that retains them but yet not allowing any of the carbon matrix 82 to be exposed within the internal foam structure. In use, the ionized flames of combustion would also be entered into such structure as with the first method disclosed herein. FIG. 14 shows a particular cross-section of a saucer shape for such a cell to take advantage of the shape of the ionizing flame of combustion with the fuel entered through port 94 and air entered through port 96 to support the ionized flame of combustion which enters the foamed thermocouple 90 through port 98 with the carbon foam matrix 92 forming a first pole 99 and second pole 100 being a continuous disk extending into a space around the cell where it will be contacted by the ionized flame of combustion. It is felt that cells of these constructions having multiple thermocouple elements will produce an increased current dependent upon the number of the conductor granules embedded into the carbon matrix structure.

Figure 15:
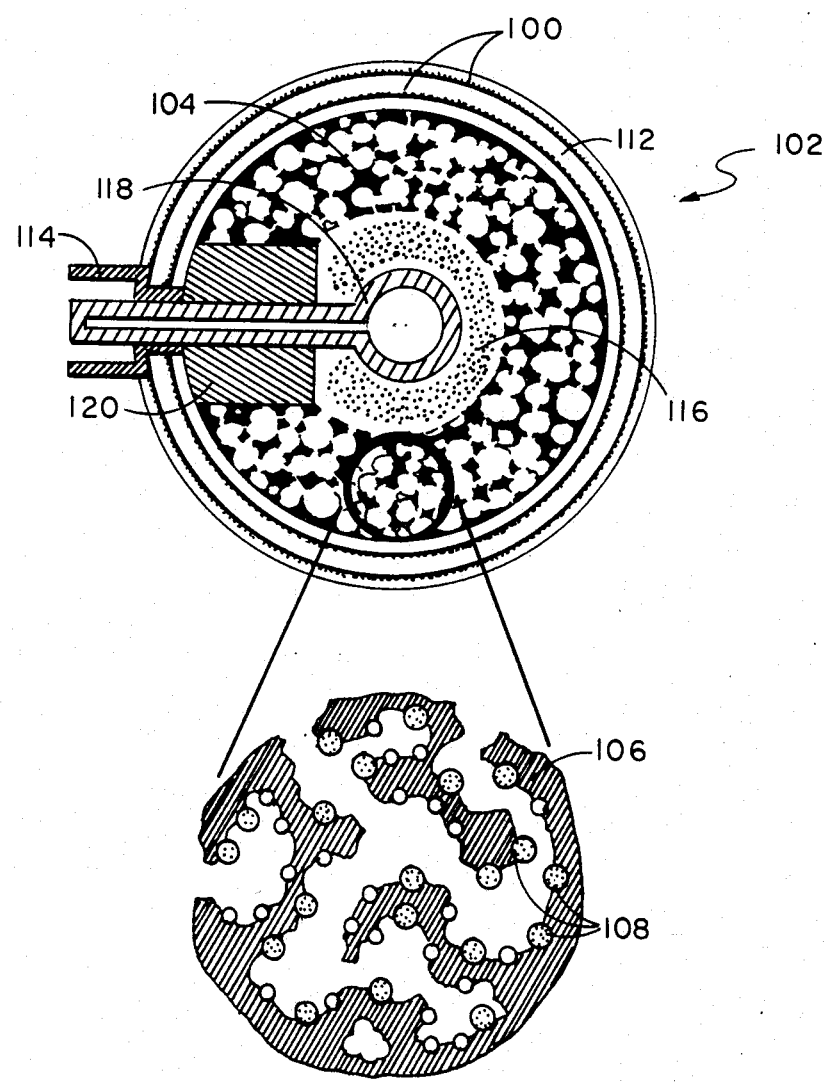
FIG. 15 illustrates a nuclear foamed multiple thermocouple cell.

Nuclear-powered cells can also use foamed multiple thermocouples to produce power. One example in FIG. 15 shows cell 102 contains foamed multiple thermocouple 104 which in the expanded section shows carbon substrate 106 with embedded boron bead 108 therein. Carbon substrate 106 is contiguous with metallic coating 100 around vacuum chamber 112. Metallic coating 110 contacts electrode 114. Thermally-active isotope and conductive medium 116 surrounds the other electrode 118 inside the cell and a portion of electrode 118 protrudes out of the cell protected by insulation 120 from contact with the multiple thermocouple 104. The thermally-active isotope and conductive material 116 enters all the spaces in the open-cellular foamed multiple thermocouple and the heat produced by the thermally-active isotope heats the multiple thermocouple and the electric potential is conducted from one side of each thermocouple through the electrically-conductive medium to electrode 118 and then outside the cell. The other side of each thermocouple conducts through the carbon substrate to the other electrode 114 thereby producing current. The conductive medium can be any suitable conductive medium such as liquid electrolytes, conductive gases or a vacuum or other equivalents. The vacuum chamber 112 around the cell insulates it and allows heat to build up therein.

Figure 16:
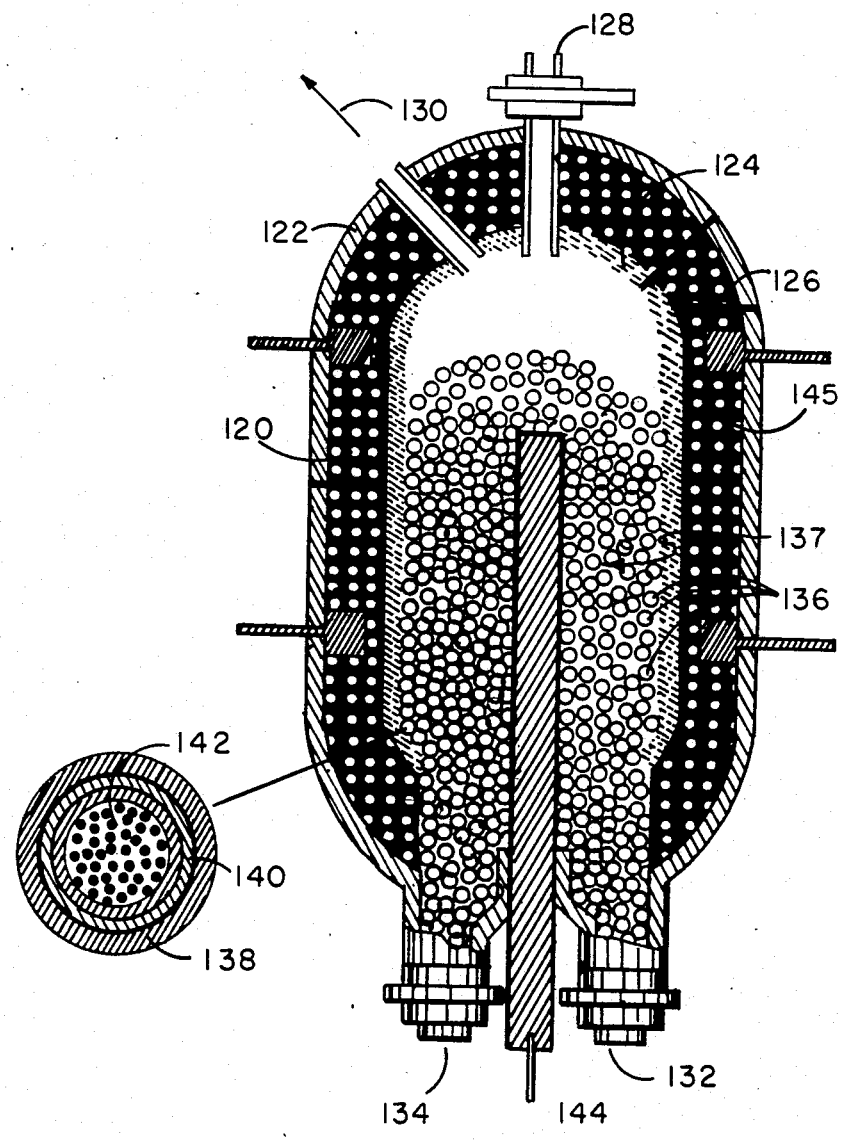
FIG. 16 illustrates an alternate embodiment of a nuclear foamed multiple thermocouple cell.

An example of a thermoelectric nuclear cell is seen in FIG. 16 wherein the multiple thermocouple foam 120 is positioned around the inside surface of container 122. A porous ceramic foam 124 can coat the multiple thermocouple foam 120 to prevent damage thereto from high temperatures. A plurality of fuel pebbles 136 can be used forming a pebble bed 137 in the interior of the cell around electrode 144 which can be the negative pole. Embedded in foam 120 are positive poles 145 which extend outside container 122. The fuel in fuel pebbles 136 can be of a radioactive material that produces heat. The heat can be carried into the multiple thermocouple foam by direct radiation through a vacuum or by heating an electrolyte 126 circulated in the cell. The fuel pebbles can be seen in the enlarged section of FIG. 16 with a radioactive material 142 surrounded by a graphite layer 138 with a silicon carbide layer 140 therebetween. Pebble exit ports 132 and 134 are provided through which the pebbles can be dumped in case the reaction gets too hot. If more pebbles are needed, they can be entered through the pebble addition port 128 in the top of the cell. A vacuum port 130 can be provided through which to evacuate the cell.

The use of pebble beds in atomic reactors is known to prevent runaway reactions as the whole bed may be dumped out causing the core to be disassembled quickly. In this invention the pebbles are coated with a substantially non-fusable substance such as graphite to prevent the pebbles from fusing together making it impossible to dump them out of the cell through the exit ports. A cell of this configuration needs no metal fuel rods which could melt or otherwise distort making them impossible to remove. When using a vacuum as a conductive medium, any problem with radioactive contaminated water is eliminated as no water is utilized in the cell's operation. The cell acts as a direct nuclear thermoelectric converter.

Although the present invention has been described with reference to particular embodiments, it will be apparent to those skilled in the art that variations and modifications can be substituted therefor without departing from the principles and spirit of the invention.

I claim:

1. An electric current-generating cell comprising:
   an open-cellular foamed multiple thermocouple having a conductive matrix with a plurality of conductors of different material from said matrix embedded in said foam matrix with a portion of each conductor exposed on the inside of said cells;
   a vessel containing such open-cellular foamed multiple thermocouple;
   an electroconductor contacting a portion of said foam matrix;
   means to excite said open-cellular foamed multiple thermocouple to produce electric current;
   electrode means to carry said electric current outside said open-cellular foamed multiple thermocouple, said electrode means being further adapted to form said cells' output terminals, said electrode means further including:
   a first electrode entered into said vessel and surrounded by said open-cellular foamed multiple thermocouple; and
   a second electrode contiguous with said electroconductor contacting said foam matrix.

2. The cell of claim 1 wherein said means to excite said thermocouples include a thermally active isotope in a conductive medium penetrating into all the foamed cells and heating said thermocouples.

3. The electric current-generating cell of claim 2 further including:
   a metallic electroconductive layer coating said open-cellular foamed multiple thermocouple;
   a vacuum chamber formed around said metallic-coated open-cellular foamed multiple thermocouple
   said first electrode extending from within the metallic-coated open-cellular foamed multiple thermocouple; and
   said second electrode positioned in the vacuum chamber formed around the metallic-coated open-cellular foam multiple thermocouple, said second electrode contacting said metallic electroconductive layer.

4. The electric current-generating cell of claim 2 wherein said thermally-active isotope is contained in fuel pebbles each having a fusing-resistant coating, said cell further including means to enter said fuel pebbles into said cell and means to remove said pebbles quickly from said cell.

5. The electric current-generating cell of claim 2 wherein said conductive medium is a vacuum.

6. The electric current-generating cell of claim 4 wherein said foamed multiple thermocouple is positioned around the insides of said cell forming a chamber in the interior thereof into which said first electrode enters and which chamber contains said fuel pebbles.

7. The electric current-generating cell of claim 6 wherein said foamed multiple thermocouple is covered by a layer of porous ceramic foam around said chamber.

* * * * *